United States Patent
Liu et al.

(10) Patent No.: US 9,857,922 B2
(45) Date of Patent: Jan. 2, 2018

(54) TOUCH PANEL AND MANUFACTURING METHOD THEREOF

(71) Applicant: TPK Touch Solutions Inc., Taipei (TW)

(72) Inventors: Chen-Yu Liu, Taoyuan (TW); Lu-Hsing Lee, Taoyuan (TW)

(73) Assignee: TPK Touch Solutions Inc., Taipei (TW)

( * ) Notice: Subject to any disclaimer, the term of this patent is extended or adjusted under 35 U.S.C. 154(b) by 359 days.

(21) Appl. No.: 14/142,717

(22) Filed: Dec. 27, 2013

(65) Prior Publication Data

US 2014/0182894 A1 Jul. 3, 2014

(30) Foreign Application Priority Data

Dec. 27, 2012 (CN) .................... 2012 2 0734259 U

(51) Int. Cl.
*H05K 1/09* (2006.01)
*G06F 3/044* (2006.01)
*G06F 3/047* (2006.01)

(52) U.S. Cl.
CPC ............. *G06F 3/044* (2013.01); *G06F 3/047* (2013.01); *G06F 2203/04103* (2013.01); *G06F 2203/04111* (2013.01); *H05K 1/09* (2013.01); *Y10T 29/49105* (2015.01)

(58) Field of Classification Search
None
See application file for complete search history.

(56) References Cited

U.S. PATENT DOCUMENTS

| | | | | |
|---|---|---|---|---|
| 2011/0032209 A1* | 2/2011 | Kim | ......................... | G06F 3/044 345/174 |
| 2011/0193801 A1* | 8/2011 | Jung | ..................... | G06F 3/0412 345/173 |
| 2012/0105344 A1* | 5/2012 | Ko | .......................... | G06F 3/044 345/173 |
| 2013/0043068 A1* | 2/2013 | Xie | ......................... | G06F 3/044 174/262 |

* cited by examiner

*Primary Examiner* — Jennifer Mehmood
*Assistant Examiner* — Stephen T Reed
(74) *Attorney, Agent, or Firm* — Paul David Bendemire

(57) ABSTRACT

A touch panel is partitioned into a sensing region and a circuit region and the circuit region is positioned around the edges of the sensing region. The touch panel comprises an electrode layer, a first wire layer, a second wire layer and an insulating layer. The electrode layer is disposed in the sensing region. The first wire layer is disposed in the circuit region and electrically connects to the electrode layer. The second wire layer electrically connects to the first wire layer in the circuit region. The insulating layer has a portion being disposed between the first wire layer and the second wire layer in the circuit, and has a plurality of first through holes wherein the first wire layer electrically connects to the second wire layer through the first through holes. The present disclosure also provides a method of manufacturing a touch panel.

20 Claims, 10 Drawing Sheets

TOUCH PANEL AND MANUFACTURING METHOD THEREOF

BACKGROUND OF THE INVENTION

All related applications are incorporated by reference. The present application is based on, and claims priority from, China Application Serial Number No. 201220734259.5, filed on Dec. 27, 2012, the disclosure of which is hereby incorporated by reference herein in its entirety.

Field of the Invention

The present invention relates to a touch sensing technique; in particular, relates to a touch panel and a manufacturing method thereof.

Description of Related Art

FIG. 1 is a schematic diagram of a traditional touch panel structure. The touch panel 10 includes first electrodes 1 and second electrodes 2 disposed in an orthogonal manner. Two ends on each of the first electrodes 1 and the second electrodes 2 are connected by wires 3 to a controller 4. External conducting bodies in contact with the electrodes changes the electric parameters of certain first electrode 1 and second electrode 2. The electric signals of altered electric parameters are transmitted to the controller 4, which processes the signals to calculate the position of contact, thereby implementing the function of sensing by touch. Logically, increasing the dimensions of the touch panel increases the path of the wires 3 connecting an end of an electrode to the controller 4. According to the resistance formula $R=\rho\rho L/S$ ($\rho\rho$ being the resistivity of the material of the wire 3, L is the length of the wire 3, and S is the cross-sectional area of the wire 3), if $\rho$ and S are held constant, a longer wire 3 results in larger resistance which leads to weakening of signals. Therefore, a conventional solution is to increase the width of the wire 3 to increase its cross-sectional area, so as to neutralize the effect of a long wire 3 on its resistance, thereby reducing the problem of signal weakening. However increasing the width of the wires 3 requires increasing the width of the frame-shielded region of the touch display device (the non-visible region on a touch cell phone) in order to keep the wires 3 from being visible. In this case, demand for a slim-framed touch display device is not satisfied.

SUMMARY OF THE INVENTION

The object of the present disclosure is to provide a touch panel which reduces touch signal weakening on large panels while satisfying demand for slim frames, and a method of manufacturing the same.

A touch panel is partitioned into a sensing region and a circuit region and the circuit region is positioned around the edges of the sensing region. The touch panel comprises an electrode layer, a first wire layer, a second wire layer and an insulating layer. The electrode layer is disposed in the sensing region. The first wire layer is disposed in the circuit region and electrically connects to the electrode layer. The second wire layer electrically connects to the first wire layer in the circuit region. The insulating layer has a portion being disposed between the first wire layer and the second wire layer in the circuit, and has a plurality of first through holes wherein the first wire layer electrically connects to the second wire layer through the first through holes.

A method of manufacturing a touch panel, which is partitioned into a sensing region and a circuit region positioned around the edges of the sensing region, is provided. The method includes the following steps: forming an electrode layer in the sensing region; forming a first wire layer, which is electrically connected to the electrode layer, in the circuit layer; forming a second wire layer electrically connected to the first wire layer in the circuit region; and forming an insulating layer having a portion being disposed between the first wire layer and the second wire layer in the circuit region, and having a plurality of first through holes wherein the first wire layer electrically connects to the second wire layer.

The aforementioned touch panel applies a dual-wire-layer design to increase the cross-sectional area of the wire layer without increasing the width of the same, thereby balancing the value of the resistance. By this configuration, the signal weakening in panels with large dimensions is reduced without increasing the width of the frame-shielded region of the touch panel, such that the touch panel can be used in touch products with large dimensions.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1:
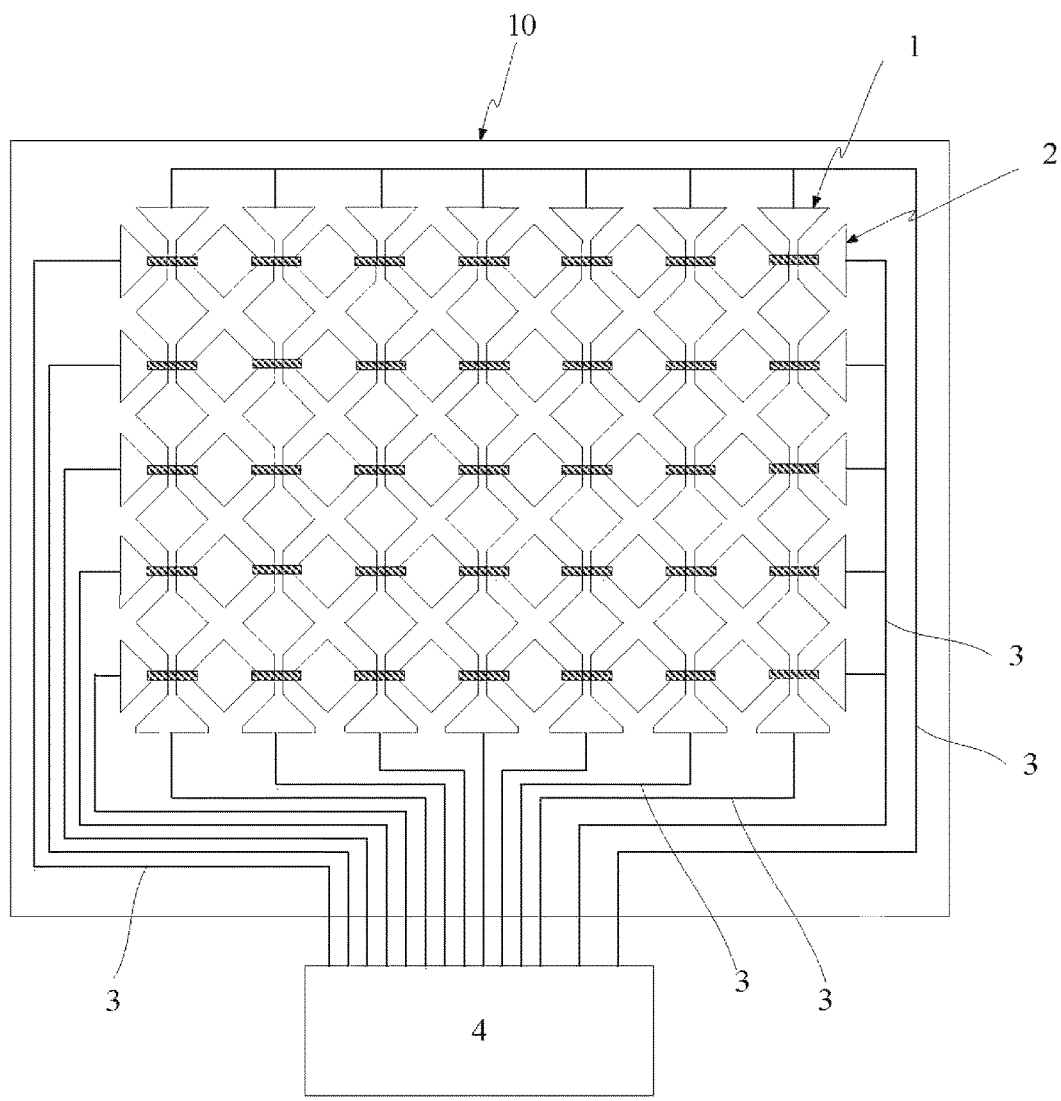
FIG. 1 is a schematic diagram of a traditional touch panel structure.
Figure 2:
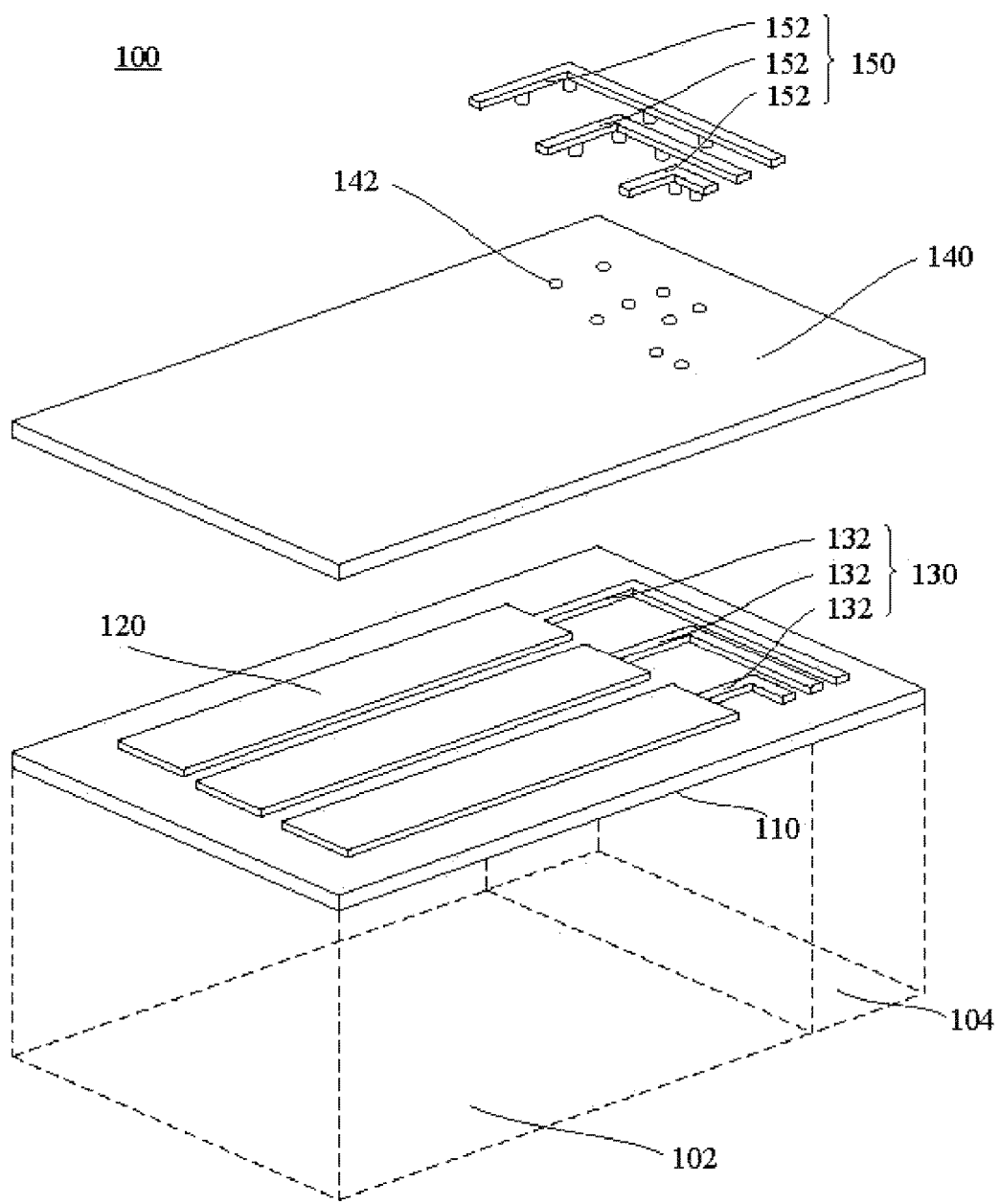
FIG. 2 is an exploded view of a touch panel according to a first embodiment.

FIG. 2 is an exploded view of a touch panel according to a first embodiment. The touch panel 100 is partitioned into a sensing region 102 and a circuit region 104 positioned along the edge of the sensing region 102. The touch panel 100 includes an electrode layer 120, a first wire layer 130, an insulating layer 140 and a second wire layer 150. The position and amount of the circuit region 104 can be adjusted according to the particular structure of the electrode layer 120 and the amount of first wires 132 included in a first wire layer 130. For example, the circuit region 104 can be positioned at one side or more than one side of the electrode layer 120. The electrode layer 120 is disposed in the sensing region 102. The first wire layer 130 is disposed in the circuit region 104 and electrically connected to the electrode layer 120. The second wire layer 150 is electrically connected to the first wire layer 130 in the circuit region 104. The portion of the insulating layer 140 in the circuit region 104 can be disposed between the first wire layer 130 and the second wire layer 150 and has a plurality of first through holes 142 wherein the first wire layer 130 electrically connects to the second wire layer 150 through the first through holes 142.

In the present embodiment, the touch panel 100 includes a substrate 110. The first wire layer 130 and the electrode layer 120 are disposed on the substrate 100. The portion of the insulating layer 140 in the sensing region 102 can be disposed on the electrode layer 120. The portion of the insulating layer 140 in the circuit region 104 can be disposed on the first wire layer 130. The insulating layer 140 disposed on the electrode layer 120 can protect the electrode layer 120.

The substrate 110 can be a glass substrate or other transparent substrates such as a polyethylene terephthalate (PET) substrate. The substrate 110 can be flat, curved or a combination of both, according to needs of different touch products. The substrate 110 can be a rigid substrate or a flexible substrate.

The electrode layer 120 can be a silver nano-wire layer, a carbon nanotube layer (CNT), a grapheme layer, a conductive polymer layer, a metal oxide layer (ITO, AZO, Gel), etc. specifically, when the electrode layer 120 uses easily-oxidized material such as silver nano-wire, the insulating layer 140 disposed on the electrode layer 120 also isolates part of the air, raising the anti-oxidation ability of the electrode layer.

The first wire layer 130 includes a plurality of first wires 132. The second wire layer 150 includes a plurality of second wires 152 respectively corresponding to the first wires 132. The position of the first through holes 142 on the insulating layer 140 correspond to the positions of the first wires 132 and the second wires 152.

The first wire layer 130 and the electrode layer 120 can be made of the same transparent conducting material such as silver nano-wire (SNW), carbon nanotube (CNT), grapheme, conductive polymer and oxidized metals (ITO, AZO, gel, etc). Given that the two layers are made of the same transparent conducting material, they can be formed at the same time. However they can also be formed separately according to the situation. The first wire layer 130 and the electrode layer 120 can also use different conducting materials. For example, the electrode layer 120 can be made of an aforementioned transparent conducting material, while the first wire layer 130 can be made of metals such as aluminum, silver, copper, metal alloys such as MoAlMo, transparent materials such as indium tin oxide, or a combination of the above. Preferably, the first wire layer 130 is made of metal which have better electrical conductivity.

The portion of the insulating layer 140 in the circuit region 104 can be disposed between the first wire layer 130 and the second wire layer 150. The position of the first through holes 142 correspond to the position of the first wires 132. The amount of the first through holes 142 can be determined by the length of the first wires 132. Namely, longer first wires 132 can have more corresponding first through holes 142, while shorter first wires 132 can have fewer corresponding first through holes 142. However the amount of first through holes formed is not limited hereto, and can be designed to have different corresponding amounts or positions. The insulating layer 140 can be a transparent insulating layer made of transparent insulating materials such as acrylate polymer and epoxide resin. In one embodiment, the portion of the insulating layer 140 in the sensing region 102 can be disposed on the electrode layer 120, and can even be disposed on the substrate 110 as well by filling in the gaps between the electrode units in the electrode layer 120. Additionally, the refractive index of the insulating layer 140 can be adjusted to reduce the problem of visibility of the electrode layer 120. More specifically, depending on the material of the electrode layer 120, the insulating layer 140 can be made by a material witch its refractive index is larger than the refractive index of the electrode layer 120 by 0.1, or a material witch its refractive index is smaller than the refractive index of the electrode layer 120 by 0.1. In another embodiment, the insulating layer 140 can be formed by layers of materials having different refractive indexes. By adjusting the different refractive indexes of the different materials of each layer, the outward appearance of the touch sensing electrode structure can be adjusted.

The second wire layer 150 can be made of metals such as aluminum, silver, copper, metal alloys such as MoAlMo, transparent materials such as indium tin oxide, or a combination of the above. Preferably, the second wire layer 150 is made of metal which have better electrical conductivity.

Figure 3:
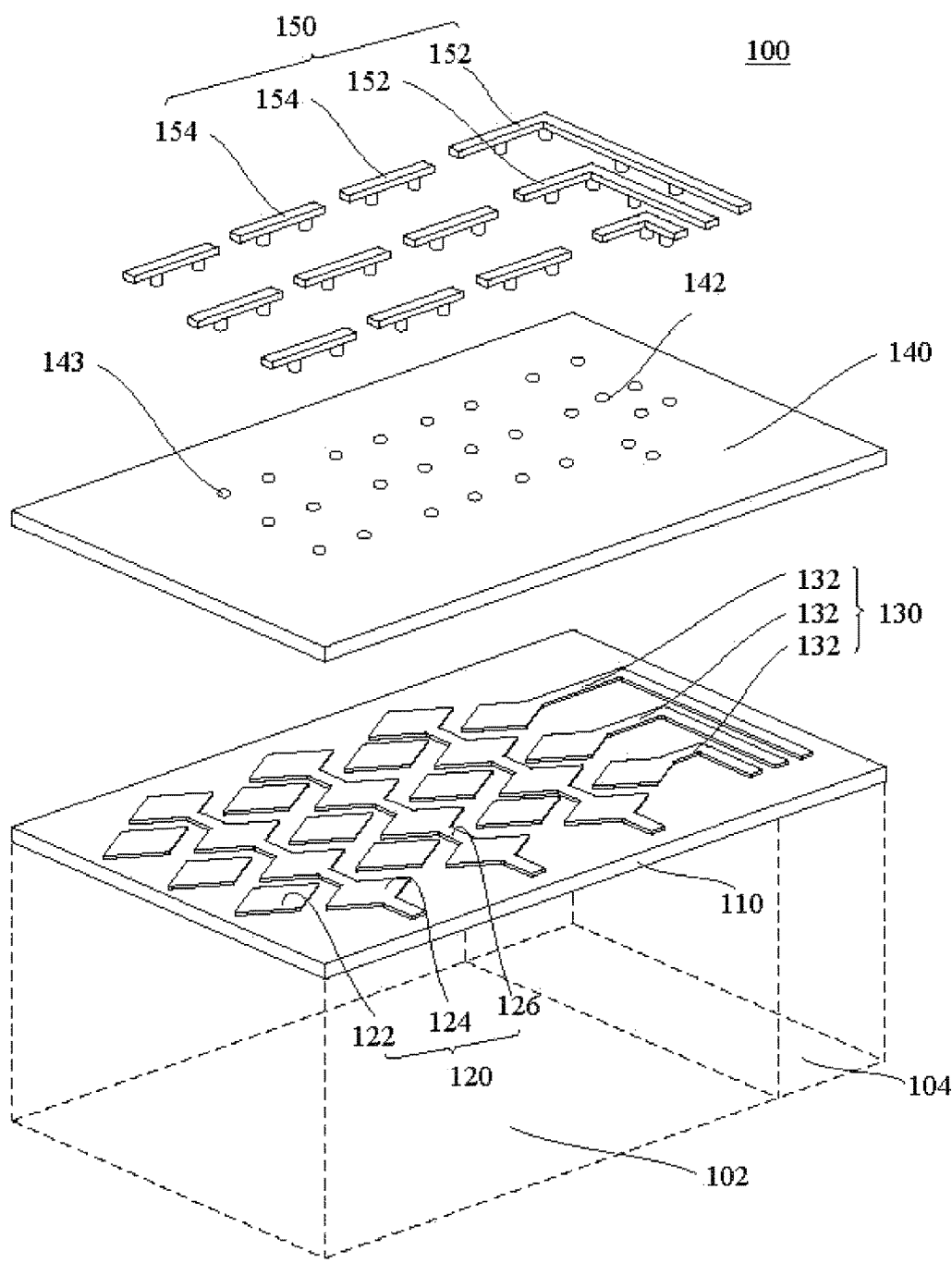
FIG. 3 is an exploded view of a touch panel according to another embodiment.

FIG. 3 is an exploded view of a touch panel according to another embodiment. In this embodiment, the electrode layer 120 includes first-direction electrode units 122 and second-direction electrode units 124 arranged at intervals, and connecting wires 126 connecting neighboring second-direction electrode units 124. The first-direction electrode units 122 are positioned on two sides of the connecting wires 126. The first-direction electrode units 122 are arranged along a first direction. The second-direction electrode units 124 are arranged along a second direction. Preferably, the first direction is perpendicular to the second direction. The second-direction electrode units 124 are connected by connecting wire 126 to form second-direction electrodes.

Correspondingly, in the present embodiment, a plurality of second through holes 143 is positioned on the portion of the insulating layer 140 in the sensing region 104. The second through holes 143 expose parts of the first-direction electrode units 122. The second through holes 143 and the first through holes 142 can be formed in the same step. The amount of the second through hole 143 corresponding to each of the first-direction electrode units 122 does not have to be one as shown in FIG. 3. The shape of the second through holes 143 can be other shapes such as a rectangle. The second wire layer 150 includes a plurality of bridge wires 154 disposed on the portion of the insulating layer 140 in the sensing region 102. The bridge wires 154 are electrically connected the first-direction electrode units 122 through the second through holes 143. The first-direction electrode units 122 arranged at intervals in the first direction are connected by the bridge wires 154 to form first-direction electrodes. Preferably, the second wires 152 and the bridge wires 154 are made of the same conducting material and formed at the same time. However the two can also be made of different materials.

Besides the above descriptions, the present embodiment is substantially similar to the previous embodiment in the connection relationship, the materials used, and the production method, which are not further detailed.

In other embodiments, a third wire layer (not shown in the figures) can be stacked in a space in the vertical direction of the circuit region of the touch panel, e.g. a third wire layer can be formed on top of the second wire layer 150 in the circuit region 104, to further enhance the signal transmission effects of the wire layers.

Additionally, in the embodiments shown in FIG. 2 and FIG. 3, the arrangement of the touch panel is in order the substrate 110, the first wire layer 130, the insulating layer 140, and the second wire layer 150. However the stacking order does not have to be limited to the above. As shown by another embodiment of the present disclosure in FIG. 4, the second wire layer 250 in the circuit region 204 is disposed on the substrate 210; the portion of the insulating region in the sensing region 202 is disposed on the substrate 210, and the portion of the insulating region 240 in the circuit region 204 is disposed on the second wire layer 250 and has a plurality of first through holes 242 whose positions correspond to the position of the second wire layer 250; the electrode layer 220 and the first wire layer 230 are disposed on the insulating layer 240, and the first wire layer 230 and the second wire layer 250 are electrically connected through the first through holes. The electrode layer 220 can use the same dual-direction electrode structure as shown in FIG. 3 or electrodes of other structures. It is not hard to see that when the electrode layer uses the electrode structure as shown in FIG. 3, the second wire layer 250 disposed on the substrate 210 can include a plurality of bridge wires disposed in the sensing region 202, and the portion of the insulating in the sensing region 202 can have a plurality of corresponding second through holes.

Besides the above descriptions, the present embodiment is substantially similar to the previous embodiment in the connection relationship, the materials used, and the production method, which are not further detailed.

Additionally, the present disclosure provides a method of manufacturing the aforementioned touch panel, including the following steps: forming an electrode layer in the sensing region; forming a first wire layer, which is electrically connected to the electrode layer, in the circuit layer; forming a second wire layer electrically connected to the first wire layer in the circuit region; and forming an insulating layer whose portion in the circuit region is disposed between the first wire layer and the second wire layer and has a plurality of first through holes which allows electrical connection between the first wire layer and the second wire layer.

The above steps can be arranged in different orders. More specifically, the touch panel of the aforementioned embodiments can be formed by the following method.

Figure 5:
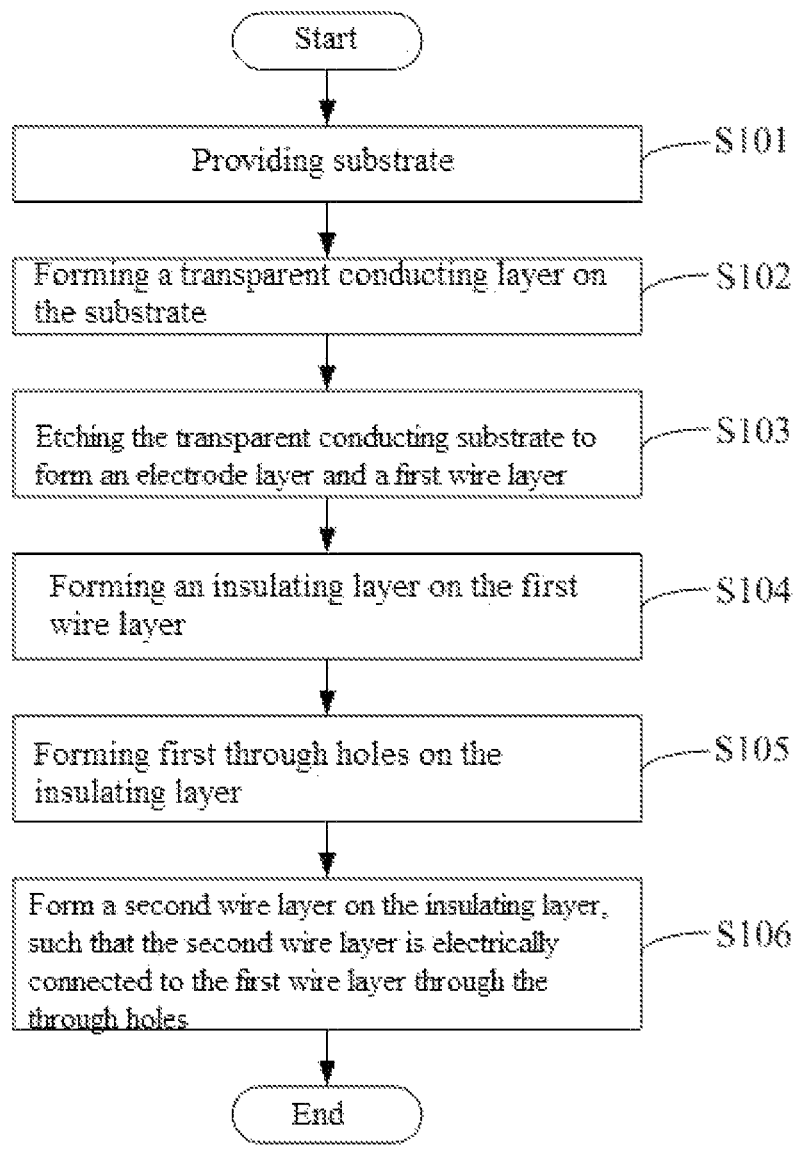
FIG. 5 is a flowchart of a method of manufacturing the touch panel of an embodiment.

FIG. 5 is a flowchart of a method of manufacturing the touch panel of an embodiment. The method includes the following steps.

Step S101: providing a substrate. The substrate 110 can be a transparent substrate such as a glass substrate or a polyethylene terephthalate (PET) substrate. The substrate 110 can have an even or curved surface, or a combination of the two, according to the needs of different touch products. The substrate 110 can be a rigid substrate or a flexible substrate.

Step S102: forming a transparent conducting layer on the substrate. The transparent conducting layer can be made of a silver nano-wire (SNW) layer, a carbon nanotube (CNT) layer, a grapheme layer, a conductive polymer layer, or a metal oxide (ITO, AZO, gel, etc) layer. The methods of forming the transparent conducting layer include printing, deposition and sputtering.

Figure 6A:
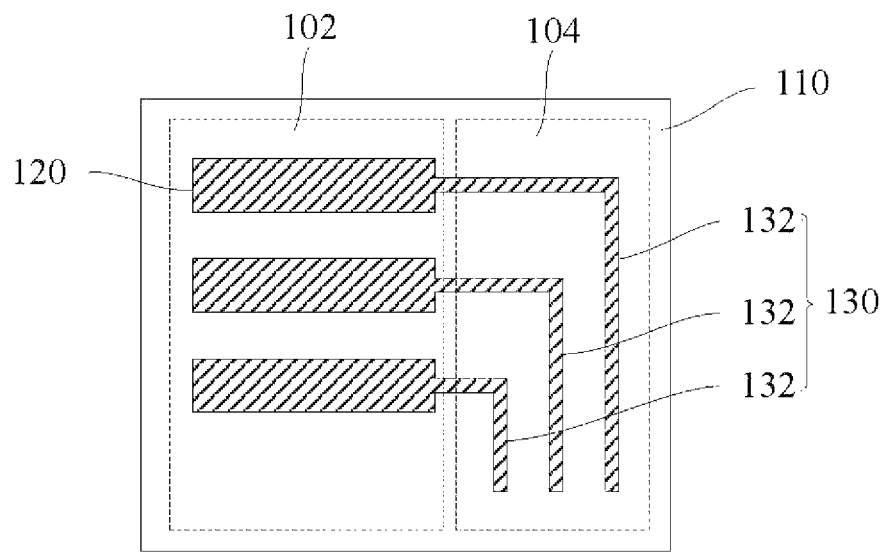
FIG. 6a-FIG. 6c are top views of a touch panel during different steps of the flowchart shown in FIG. 5.

Step S103: etching the transparent conducting layer to form an electrode layer and a first wire layer. Referring to FIG. 6a, the first wire layer 130 and the electrode layer 120 are formed on the substrate 110, and the first wires 130 are positioned in the circuit region 10 while the electrode layer 120 is positioned in the sensing region 102. The first wire layer 130 include a plurality of first wires 132 electrically connected to different electrodes of the electrode layer 120. In the present embodiment, the first wire layer 130 and the electrode layer 120 are made of the same transparent conducting material and are formed at the same time. However they can also be formed separately according to the procedure. The first wire layer 130 and the electrode layer 120 can also be made of different conducting materials. For example the electrode layer 120 is made of the aforementioned transparent conducting material, while the first wire layer 130 can be made of metals such as aluminum, silver, copper, metal alloys such as MoAlMo, transparent materials such as indium tin oxide, or a combination of the above. Preferably, the first wire layer 130 is made of metal which have better electrical conductivity.

Figure 6B:
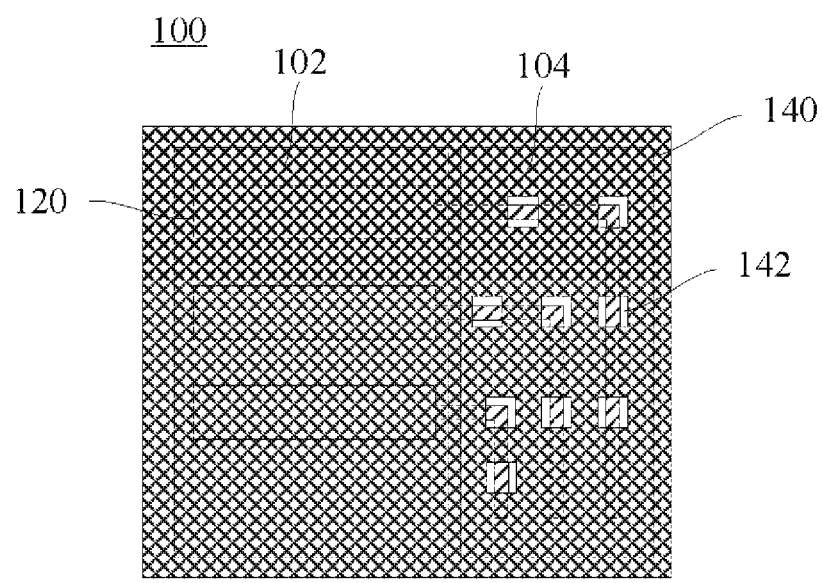

Step S104: forming an insulating layer on the first wire layer. Referring to FIG. 6b, the insulating 140 is formed on the first wire layer 130. In the present embodiment, the insulating layer 140 is formed on the electrode layer 120 as well. Namely, the portion of the insulating layer 140 in the sensing region 102 is formed on the electrode layer 120, and the portion of the insulating layer 140 in the circuit region 104 is formed on the first wire layer 130. The insulating layer 140 can be made of transparent insulating materials such as acrylate polymer and epoxide resin.

Figure 6C:
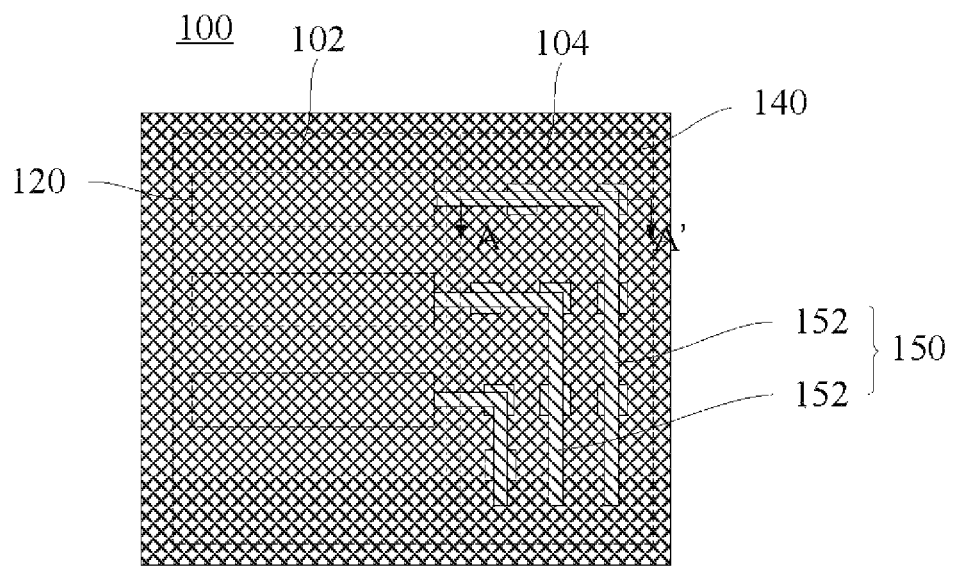

Step S105: forming a first through hole on the insulating layer. The first through hole 142 is formed on the insulating layer 140. The position of the first through hole 142 correspond to the position of a first wire 132. In another embodiment, printing can be used to directly form an insulating layer having a first through hole 142. Referring again to FIG. 3, when the electrode layer 120 has the electrode structure as shown in FIG. 3, namely when the electrode layer 120 includes first-direction electrode units 122 and second-direction electrode units 124 arranged at intervals and connecting wires 126 connecting neighboring second-direction electrode units 122, and the first electrode units 122 are positioned on two sides of the connecting wires 126, a plurality of second through holes 143 are formed on the portion of the insulating layer 140 in the sensing region 102. The second through holes 143 expose parts of the first-direction electrode units 122. The first through holes 142 and the second through holes 143 can be formed in the same step Step S106: forming a second wire layer on the insulating layer such that the second wire layer is electrically connected to the first wire layer through the first through holes. Referring to FIG. 6c, form the second wire layer 150 on the insulating layer 140 corresponding to the position of the first wire layer 130. The second wire layer 150 can be made of metals such as aluminum, silver, copper, metal alloys such as MoAlMo, transparent materials such as indium tin oxide, or a combination of the above. Preferably, the second wire layer 150 is made of metal which have better electrical conductivity. When the electrode layer 120 has the electrode structure as shown in FIG. 3, the second wire layer 150 includes a plurality of bridge wires 154 formed on the portion of the insulating layer 140 in the sensing region 102. The bridge wires 154 electrically connect neighboring first-direction electrode units 122 through the second through holes 143.

Figure 6D:
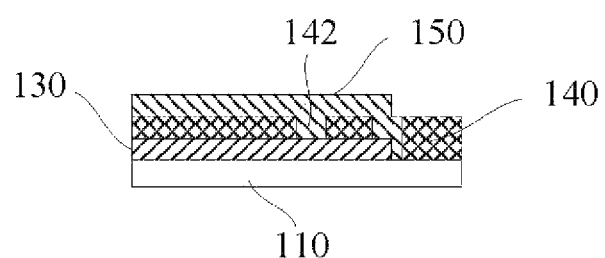
FIG. 6d is a cross-sectional view of FIG. 6c along the section line A-A'.

FIG. 6d is a cross-sectional view of FIG. 6c along the section line A-A' and shows the stacking structure in the circuit region 104. The insulating layer 140 covers the first wire layer 130 and the substrate 110. The second wire layer 150 is electrically connected to the first wire layer 130 through the first through holes 142 of the insulating layer 140.

In other embodiments, a second wire layer can be formed on the substrate first, before subsequently forming the insulating layer and then the first wire layer and the electrode layer.

Figure 7:
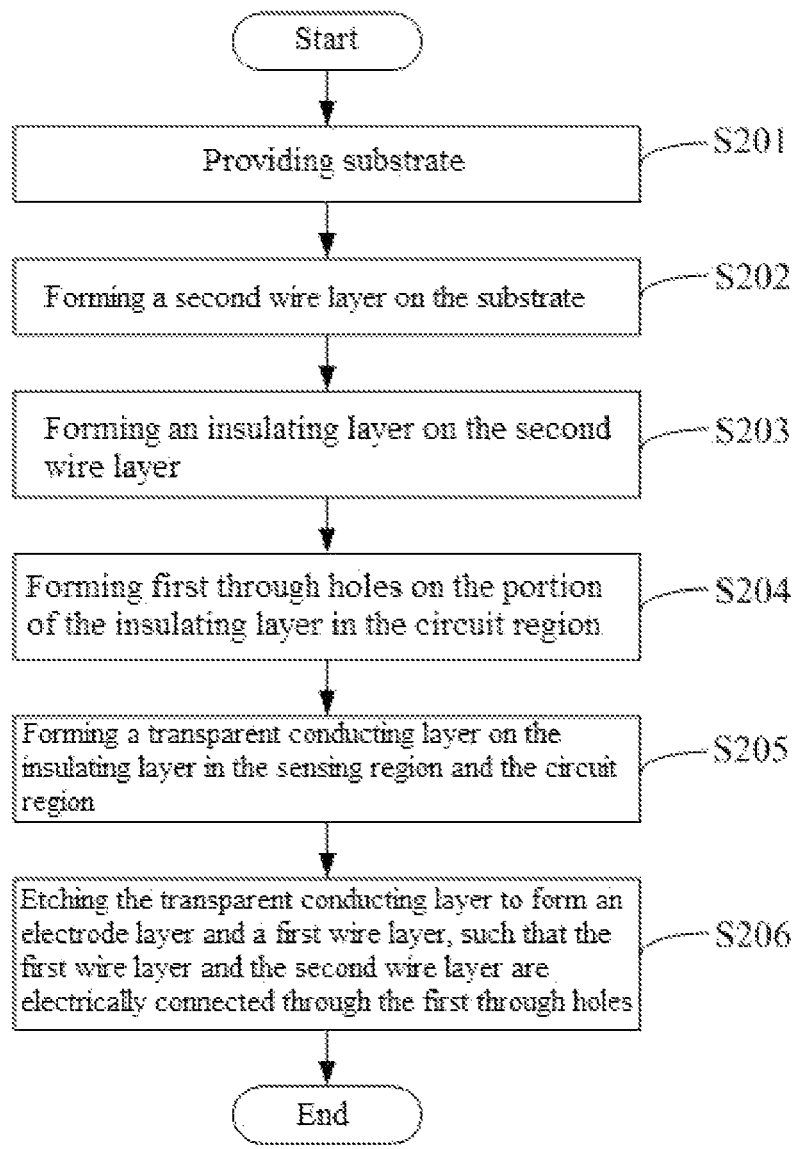
FIG. 7 is a flow chart of a method of manufacturing the touch panel of another embodiment.

FIG. 7 is a flow chart of a method of manufacturing the touch panel of an embodiment. The method includes the following steps.

Step S201: providing a substrate. The substrate 210 can be glass substrate or a polyethylene terephthalate (PET) substrate.

Figure 8A:
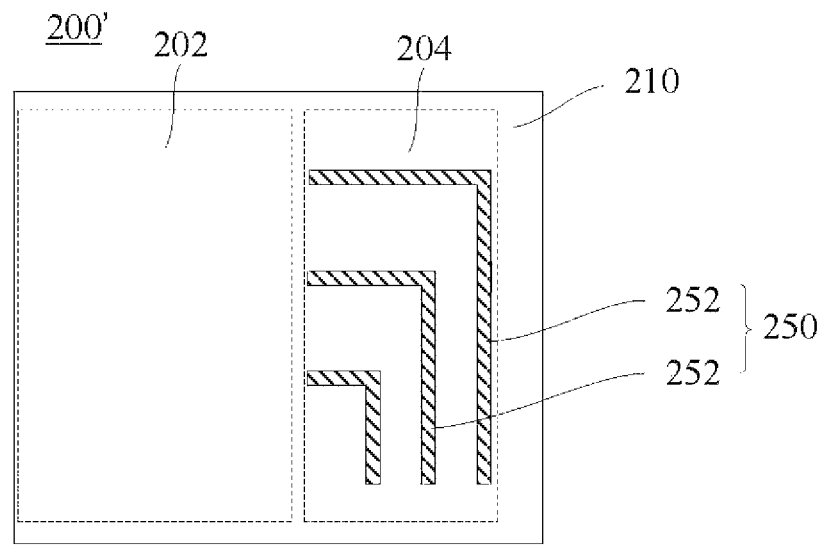
FIG. 8a-FIG. 8c are top views of a touch panel during different steps of the flowchart shown in FIG. 7.

Step S202: forming a second wire layer on the substrate. Referring to FIG. 8*a*, the second wire layer 250 is formed on the substrate in the circuit region. The second wire layer 250 includes a plurality of second wires 252. The second wire layer 250 can be made of metals such as aluminum, silver, copper, metal alloys such as MoAlMo, transparent materials such as indium tin oxide, or a combination of the above. Preferably, the second wire layer 250 is made of metal which have better electrical conductivity.

Figure 8B:
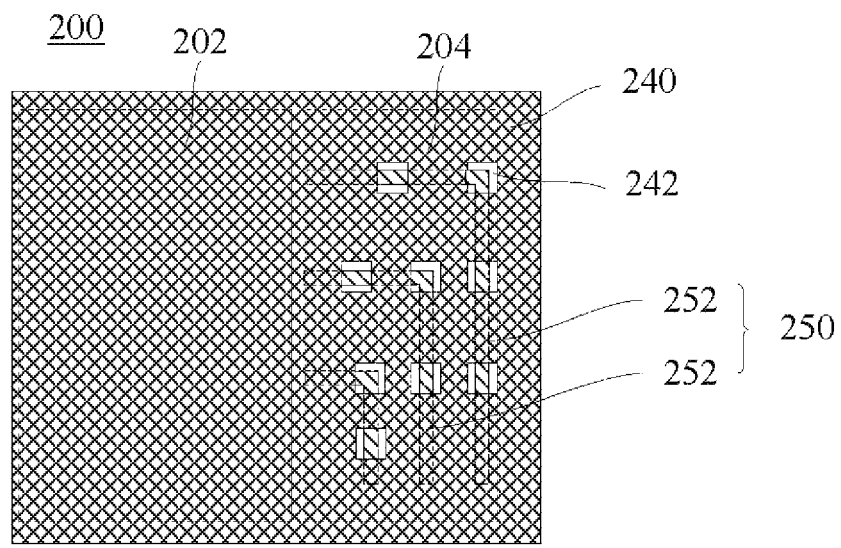

Step 203: forming an insulating on the second wire layer. Referring to FIG. 8*b*, the insulating layer 240 is formed on the second wire layer 250. In the present step, the insulating layer 240 can extend into the sensing region and be formed on the substrate 210. Namely, the portion of the insulating layer 140 in the sensing region 202 is formed on the substrate 210. The portion of the insulating layer 240 in the circuit region 204 is formed on the second wire layer 250. The insulating layer 240 can be made of transparent insulating materials such as acrylate polymer and epoxide resin.

Step S204: forming a first through hole on the portion of the insulating layer in the circuit region. The first through hole 242 is formed on the portion of the insulating layer 240 in the circuit region 104. The position of the first through hole 242 correspond to the position of a second wire 252. In another embodiment, printing can be used to directly form an insulating layer having a first through hole 242.

Step S205: forming a transparent conducting layer on the insulating layer in the sensing region and the circuit region. The transparent conducting layer can be made of a silver nano-wire (SNW) layer, a carbon nanotube (CNT) layer, a grapheme layer, a conductive polymer layer, or a metal oxide layer (ITO, AZO, gel, etc). The methods of forming the transparent conducting layer include printing, deposition and sputtering.

Figure 8C:
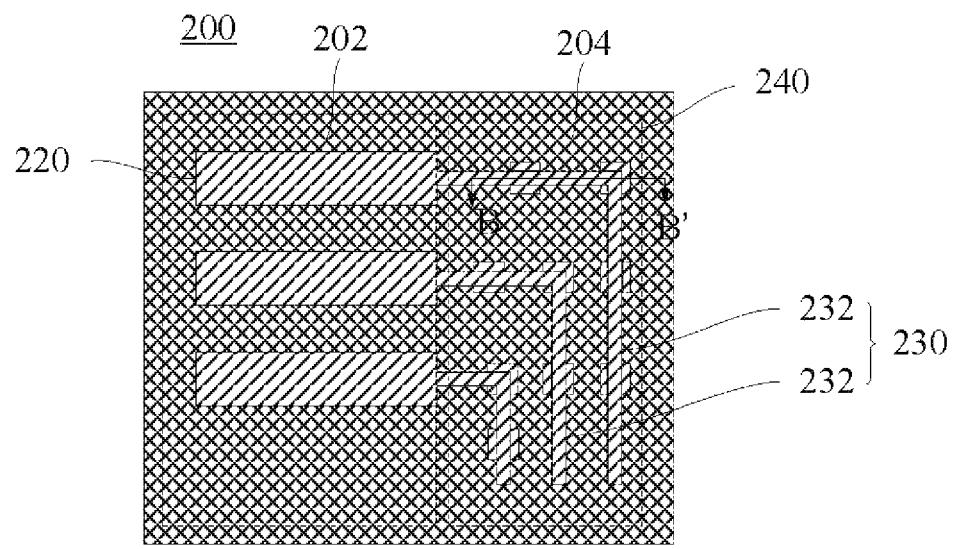

Step S206: etching the transparent conducting layer to form an electrode layer and a first wire layer, such that the second wire layer is electrically connected to the first wire layer through the first through holes. Referring to FIG. 8*c*, the electrode layer 220 is formed on the portion of the insulating layer 240 in the sensing region 202, and the first wire layer 230 is formed on the portion of the insulating region in the circuit region 204. The first wire layer 230 includes a plurality of first wires 232 respectively electrically connected to different electrodes of the electrode layer 220. In the present embodiment, the first wire layer 230 and the electrode layer 220 are made at the same time with the same transparent conducting material. However they can also be formed separately according to the situation. The first wire layer 230 and the electrode layer 220 can be made of different materials. For example the electrode layer 220 is made of the aforementioned transparent conducting material, while the first wire layer 230 can be made of metals such as aluminum, silver, copper, metal alloys such as MoAlMo, transparent materials such as indium tin oxide, or a combination of the above. Preferably, the first wire layer 230 is made of metal which have better electrical conductivity.

Figure 8D:
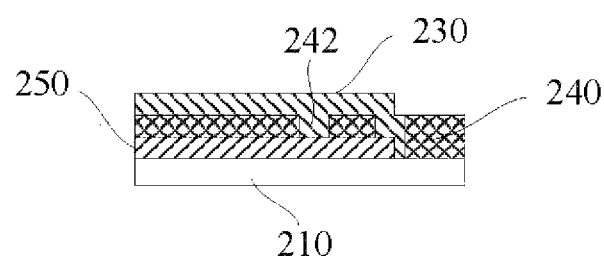
FIG. 8d is a cross-sectional view of FIG. 8c along the section line B-B'.

FIG. 8*d* is a cross-sectional view of FIG. 8*c* along the section line B-B' and shows the stacking structure in the circuit region 204. The insulating layer 240 covers the second wire layer 250 and the substrate 210. The first wire layer 230 is electrically connected to the second wire layer 250 through the first through holes 242 of the insulating layer 240.

Figure 4:
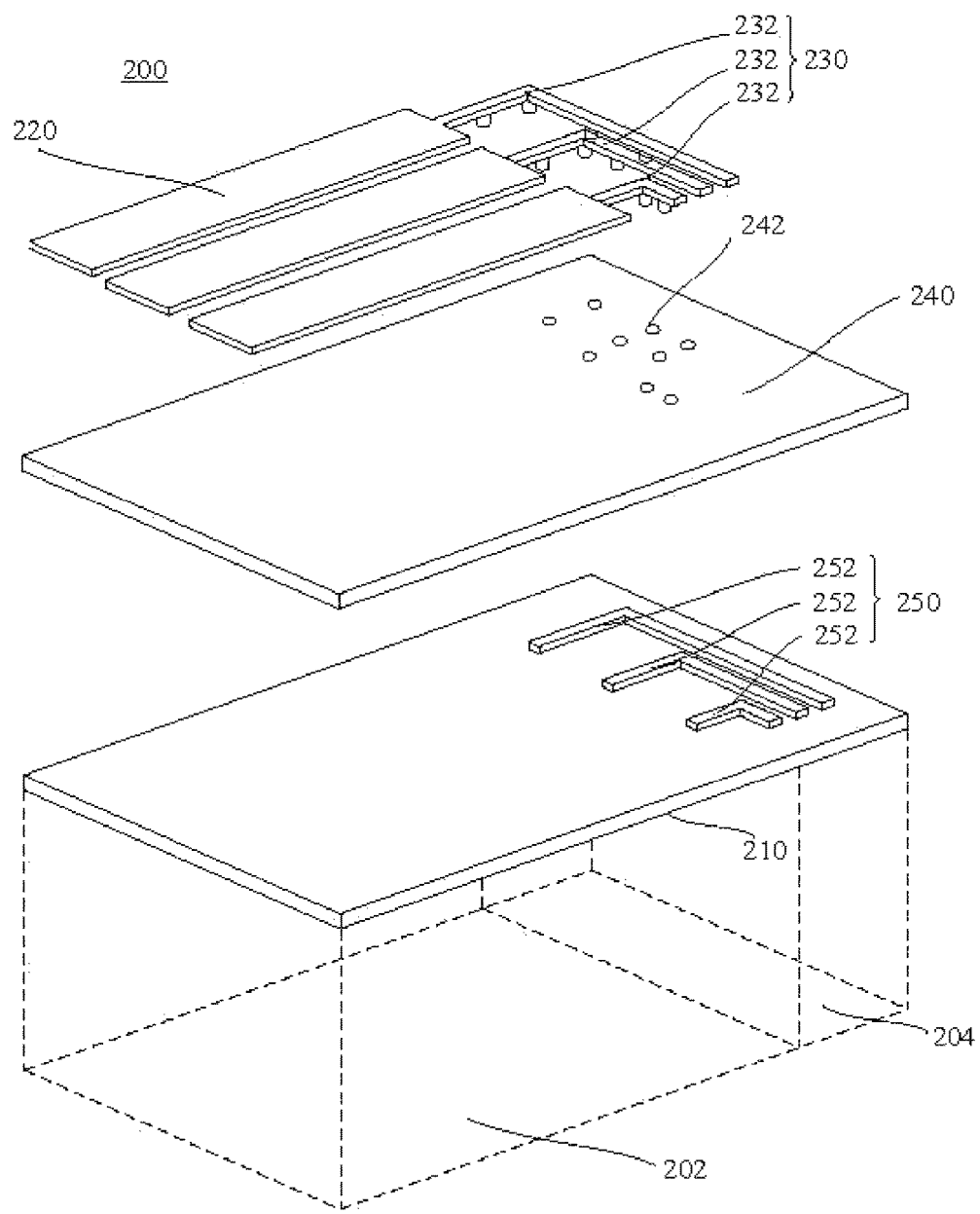
FIG. 4 is an exploded view of a touch panel according to yet another embodiment.

It is not hard to see from the present embodiment that when the electrode layer 220 uses the electrode structure as shown in FIG. 3 or FIG. 4, corresponding bridge wires need to be formed with the second wire layer 250 in step S202, and the second through holes can be formed on the portion of the insulating layer 240 extending into the sensing region 202 in step S204.

According to the aforementioned embodiments, the dual-wire-layer design increases the cross-sectional area of the wire layer without increasing the width of the same, thereby balancing the value of the resistance. By this configuration, the signal weakening in panels with large dimensions is reduced without increasing the width of the frame-shielded region of the touch panel, such that the touch panel can be used in touch products with large dimensions.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A touch panel having a sensing region and a circuit region located on an edge of the sensing region, the touch panel comprising:
   an electrode layer disposed in the sensing region;
   a first wire layer disposed in the circuit region and electrically connected to the electrode layer;
   a second wire layer electrically connected to the first wire layer in the circuit region; and
   an insulating layer having a portion disposed between the first wire layer and the second wire layer in the circuit region and having a plurality of first through holes in the circuit region, wherein:
      one of the first wire layer or the second wire layer is positioned over the insulating layer, disposed in the plurality of first through holes, and in contact with the other one of the first wire layer or the second wire layer positioned under the insulating layer, such that the first wire layer electrically connects to the second wire layer through the plurality of first through holes at a plurality of locations in the circuit region, and
      the first wire layer comprises a first wire and the second wire layer comprises a second wire, wherein each of the first wire and the second wire extend continuously from a first instance of the plurality of first through holes to a second instance of the plurality of first through holes such that the first wire and the second wire are electrically coupled in parallel through at least the first instance of the plurality of first through holes and the second instance of the plurality of first through holes.

2. The touch panel according to claim 1, wherein:
   the first wire layer comprises a plurality of first wires, and
   the second wire layer comprises a plurality of second wires corresponding to the first wires.

3. The touch panel according to claim 1, wherein:
   the first wire layer and the electrode layer are disposed on a substrate,
   a portion of the insulating layer in the sensing region is disposed on the electrode layer, and
   the portion of the insulating layer in the circuit region is disposed on the first wire layer.

4. The touch panel according claim 1, wherein the first wire layer and the electrode layer are made of a same transparent conducting material.

5. The touch panel according to claim 3, wherein:
the electrode layer comprises first-direction electrode units and second-direction electrode units being arranged at intervals and connecting wires connecting neighboring second-direction electrode units,
the first-direction electrode units are disposed on two sides of the connecting wires,
the portion of the insulating layer in the sensing region has a plurality of second through holes,
the plurality of second through holes expose parts of the first-direction electrode units,
the second wire layer comprises a plurality of bridge wires disposed on the portion of the insulating layer in the sensing region, and
the plurality of bridge wires electrically connect neighboring first-direction electrode units through the plurality of second through holes.

6. The touch panel according to claim 1, wherein:
the second wire layer in the circuit region is disposed on a substrate,
a portion of the insulating layer in the sensing region is disposed on the substrate, and
the portion of the insulating layer in the circuit region is disposed on the second wire layer.

7. The touch panel according to claim 1, wherein the second wire layer is made of metal, metal alloy, transparent conducting material, or a combination of the same.

8. The touch panel according to claim 1, wherein the insulating layer is formed by materials of different refractive indexes stacked together.

9. A method of manufacturing a touch panel having a sensing region and a circuit region located on an edge of the sensing region, the method comprising:
forming an electrode layer in the sensing region;
forming a first wire layer in the circuit region, wherein the first wire layer is electrically connected to the electrode layer;
forming a second wire layer, wherein the second wire layer is electrically connected to the first wire layer in the circuit region; and
forming an insulating layer having a portion disposed between the first wire layer and the second wire layer in the circuit region and having a plurality of first through holes in the circuit region, wherein:
one of the first wire layer or the second wire layer is positioned over the insulating layer, disposed in the plurality of first through holes, and in contact with the other one of the first wire layer or the second wire layer positioned under the insulating layer, such that the first wire layer electrically connects to the second wire layer through the plurality of first through holes at a plurality of locations in the circuit region, and
the first wire layer comprises a first wire and the second wire layer comprises a second wire, wherein each of the first wire and the second wire extend continuously from a first instance of the plurality of first through holes to a second instance of the plurality of first through holes such that the first wire and the second wire are electrically coupled in parallel through at least the first instance of the plurality of first through holes and the second instance of the plurality of first through holes.

10. The method of manufacturing a touch panel according to claim 9, wherein:
the first wire layer and the electrode layer are disposed on a substrate,
a portion of the insulating layer in the sensing region is disposed on the electrode layer, and
the portion of the insulating layer in the circuit region is disposed on the first wire layer.

11. The method of manufacturing a touch panel according to claim 10, wherein the forming the electrode layer and the first wire layer on the substrate comprises:
forming a transparent conducting layer on the substrate; and
etching the transparent conducting layer to form the electrode layer and the first wire layer.

12. The method of manufacturing a touch panel according to claim 10, wherein:
the electrode layer comprises first-direction electrode units and second-direction electrode units arranged at intervals and connecting wires connecting neighboring second-direction electrode units,
the first-direction electrode units are disposed on two sides of the connecting wires,
the portion of the insulating layer in the sensing region has a plurality of second through holes,
the plurality of second through holes expose parts of the first-direction electrode units,
the second wire layer comprises a plurality of bridge wires disposed on the portion of the insulating layer in the sensing region, and
the plurality of bridge wires electrically connect neighboring first-direction electrode units through the plurality of second through holes.

13. The method of manufacturing a touch panel according to claim 9, wherein:
the second wire layer in the circuit region is disposed on a substrate,
a portion of the insulating layer in the sensing region is disposed on the substrate, and
the portion of the insulating layer in the circuit region is disposed on the second wire layer.

14. A touch panel having a sensing region and a circuit region located on an edge of the sensing region, the touch panel comprising:
an electrode layer disposed in the sensing region;
a first wire disposed in the circuit region and electrically connected to the electrode layer;
a second wire electrically connected to the first wire in the circuit region; and
an insulating layer having a portion disposed between the first wire and the second wire in the circuit region and having a plurality of first through holes, wherein one of the first wire or the second wire is positioned over the insulating layer, disposed in the plurality of first through holes, and in contact with the other one of the first wire or the second wire positioned under the insulating layer, such that the first wire and the second wire are electrically coupled in parallel through at least some of the plurality of first through holes.

15. The touch panel according to claim 14, wherein the first wire and the second wire each extend continuously from a first instance of the plurality of first through holes to a second instance of the plurality of first through holes.

16. The touch panel according to claim 14, wherein the first wire and the second wire are made of a different material than the electrode layer.

17. The touch panel according to claim 14, wherein the first wire and the second wire are made of a non-transparent conducting material and the electrode layer is made of a transparent conducting material.

18. The touch panel according to claim 14, wherein a top surface of the first wire and a top surface of the second wire have a same shape.

19. The touch panel according to claim 14, wherein the insulating layer is formed by materials of different refractive indexes stacked together.

20. The touch panel according to claim 14, wherein:
the first wire and the electrode layer are disposed on a substrate,
a portion of the insulating layer in the sensing region is disposed on the electrode layer, and
the portion of the insulating layer in the circuit region is disposed on the first wire.

* * * * *